United States Patent
Morris et al.

(10) Patent No.: US 9,985,611 B2
(45) Date of Patent: May 29, 2018

(54) TUNNEL FIELD-EFFECT TRANSISTOR (TFET) BASED HIGH-DENSITY AND LOW-POWER SEQUENTIAL

(71) Applicant: Intel Corporation, Santa Clara, CA (US)

(72) Inventors: Daniel H. Morris, Hillsboro, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/922,072

(22) Filed: Oct. 23, 2015

(65) Prior Publication Data

US 2017/0117885 A1 Apr. 27, 2017

(51) Int. Cl.
*H03K 3/356* (2006.01)
*H01L 29/66* (2006.01)
*H03K 3/012* (2006.01)
*H03K 3/3562* (2006.01)

(52) U.S. Cl.
CPC .. *H03K 3/356113* (2013.01); *H01L 29/66977* (2013.01); *H03K 3/012* (2013.01); *H03K 3/35625* (2013.01)

(58) Field of Classification Search
None
See application file for complete search history.

(56) References Cited

U.S. PATENT DOCUMENTS

| | | | | |
|---|---|---|---|---|
| 3,808,462 A | * | 4/1974 | Parrish | G11C 19/184 326/97 |
| 3,973,139 A | * | 8/1976 | Dingwall | H03K 3/037 327/281 |
| 4,521,695 A | * | 6/1985 | Mazin | H03K 3/356104 326/97 |
| 4,629,909 A | * | 12/1986 | Cameron | H03K 3/356017 327/211 |
| 5,177,568 A | * | 1/1993 | Honma | H01L 29/47 257/295 |

(Continued)

FOREIGN PATENT DOCUMENTS

| | | |
|---|---|---|
| WO | 2015147832 | 10/2015 |
| WO | 2015147838 | 10/2015 |

OTHER PUBLICATIONS

Hanninen et al., Adiabatic CMOS: Limits of Reversible Energy Recovery and First Steps for Design Automation, 2014, Springer-Verlag, Transactions on Computational Science XXIV, LNCS 8911, pp. 1-20.*

(Continued)

*Primary Examiner* — Thomas J Hiltunen
(74) *Attorney, Agent, or Firm* — Green, Howard & Mughal LLP

(57) ABSTRACT

Described is an apparatus which comprises: a first p-type Tunneling Field-Effect Transistor (TFET); a first n-type TFET coupled in series with the first p-type TFET; a first node coupled to gate terminals of the first p-type and n-type TFETs; a first clock node coupled to a source terminal of the first TFET, the first clock node is to provide a first clock; and a second clock node coupled to a source terminal of the second TFET, the second clock node is to provide a second clock.

20 Claims, 10 Drawing Sheets

(56) References Cited

U.S. PATENT DOCUMENTS

| | | | | |
|---|---|---|---|---|
| 5,179,295 | A * | 1/1993 | Mattison | H03K 3/037 327/141 |
| 5,378,940 | A * | 1/1995 | Knight, Jr. | H03K 19/0019 326/121 |
| 5,517,145 | A * | 5/1996 | Frank | H03K 3/356147 327/201 |
| 5,675,263 | A * | 10/1997 | Gabara | H03K 19/0963 326/121 |
| 5,701,093 | A * | 12/1997 | Suzuki | H03K 19/0019 326/21 |
| 5,926,519 | A * | 7/1999 | Yoshikawa | G11C 19/00 377/54 |
| 5,936,455 | A * | 8/1999 | Kobayashi | G05F 3/247 327/437 |
| 6,188,636 | B1 * | 2/2001 | Salomon | G11C 7/1051 327/202 |
| 6,310,500 | B1 * | 10/2001 | Varma | G11C 7/1078 327/211 |
| 6,489,825 | B1 * | 12/2002 | Pasqualini | H03K 3/012 327/201 |
| 7,365,566 | B2 * | 4/2008 | Aoyama | H03K 19/17728 326/38 |
| 8,258,771 | B2 * | 9/2012 | Sato | H02M 3/155 323/318 |
| 8,405,460 | B2 * | 3/2013 | Hunt | H03F 1/308 330/267 |
| 8,866,346 | B2 * | 10/2014 | Sato | H03H 7/0115 307/104 |
| 9,024,668 | B1 * | 5/2015 | Baek | H03K 5/06 327/159 |
| 9,362,919 | B1 * | 6/2016 | Sedighi | H03K 19/195 |
| 2008/0218235 | A1 * | 9/2008 | Sekine | H03K 3/35625 327/212 |
| 2011/0019604 | A1 * | 1/2011 | Chun | H04L 1/1887 370/312 |
| 2011/0299326 | A1 * | 12/2011 | Saripalli | G11C 11/412 365/156 |
| 2012/0106236 | A1 | 5/2012 | Singh et al. | |
| 2012/0199814 | A1 * | 8/2012 | Berger | H01L 29/7391 257/24 |
| 2015/0043260 | A1 | 2/2015 | Liu et al. | |
| 2016/0133695 | A1 * | 5/2016 | Huang | H01L 29/36 257/9 |

OTHER PUBLICATIONS

Avci et al. "Tunnel Field-Effect Transistors: Prospects and Challenges", Digital Object Identifier 10.1109/JEDS.2015.2390591. Date of current version Apr. 22, 2015.

International Search Report & Written Opinion dated Nov. 21, 2016 for PCT Patent Application No. PCT/US2016/050276.

* cited by examiner

TUNNEL FIELD-EFFECT TRANSISTOR (TFET) BASED HIGH-DENSITY AND LOW-POWER SEQUENTIAL

BACKGROUND

Sequential circuits such as Flip-Flops (FFs) and latches are clocked memory elements that store logic states within digital logic circuits. FFs and latches consume a dominant component of a logic area. For some important logic blocks, this component can be 40% of the total area, for example. Power, particularly dynamic clock power, is an important attribute of the FF. Dynamic clock power includes not only the load on the clock tree, but more importantly the power dissipated inside the FF as the clock toggles. Minimizing (i.e., reducing) internal clock power and achieving circuit robustness are important considerations for FF circuit topologies.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
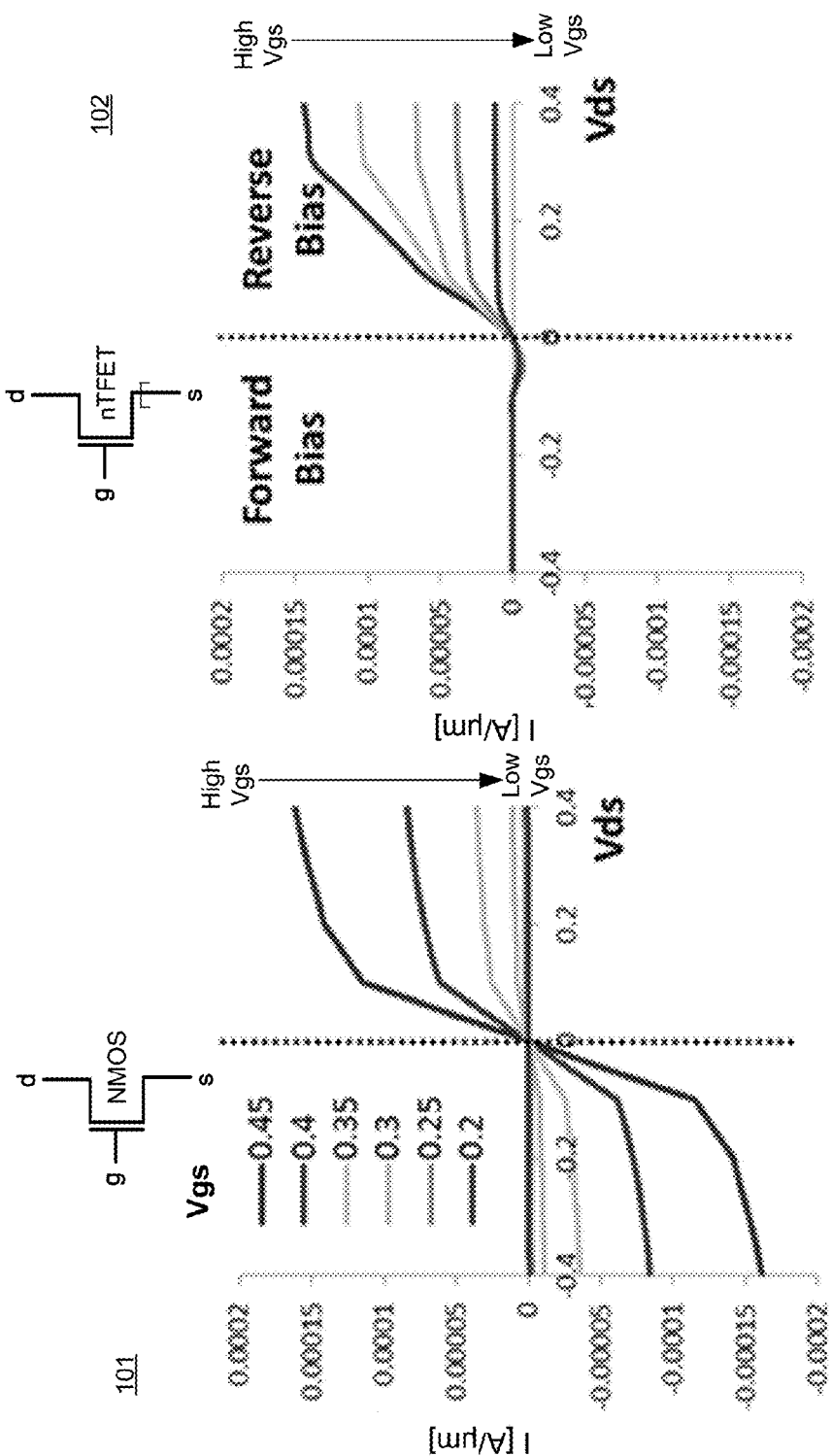
FIG. 1 illustrates plots showing the Current-Voltage (IV) characteristics of an n-type Metal Oxide Semiconductor (NMOS) transistor with symmetric conduction and an n-type Tunneling Field Effect Transistor (nTFET) with asymmetric conduction with respect to the drain-source bias, respectively.

Reducing supply voltage (VDD) while keeping leakage current low is an important factor for minimizing energy consumption and for improving mobile device battery life. The thermal limit of Metal Oxide Field Effect Transistor (MOSFET) subthreshold swing (SS) restricts lowering threshold voltage (Vt), causing significant performance degradation at low VDD. A Tunneling Field Effect Transistor (TFET) is not limited by this thermal tail and may perform better at low VDD.

In some ways, the structure of a TFET is similar to that of a Complementary Metal Oxide Semiconductor (CMOS) transistor, but the switching mechanisms are different. For example, TFETs switch by modulating quantum tunneling through a barrier while CMOS transistors switch by modulating thermionic emission over a barrier. In a CMOS transistor, the sub-threshold slope has a theoretical lower limit due to kT/q (i.e., 60 mV/decade at room temperature) where 'k' is the Boltzmann's constant, 'T' is the absolute temperature, and 'q' is a magnitude of electron charge on an electron.

Subthreshold slope concerns the slope of Id current versus Vgs voltage characteristics near the device's "off state" (i.e., where drain current ($I_d$) is small, also referred to as $I_{off}$ or "off-current") and the device's "on state" (i.e., where there is substantial $I_d$, also referred to as $I_{on}$ or "on-current"). For a given off current target (which is determined, for example, by a standby power requirement for a device that includes the MOSFET), $I_d$ for a MOSFET can only increase at this maximum rate of 60 mV per decade of Id. This may limit the on-current and, consequently, limit the circuit performance (e.g., speed of transistor switching).

For low active-power, a CMOS transistor is very favorable to operate at lower supply voltages because of active power's square dependence on supply voltage (i.e., $P\alpha CV^2$, where 'P' is power, 'C' is capacitance and 'V' is the supply voltage). However, due to limited (kT/q) rate of increase of current from off-current to on-current, when a CMOS transistor s operated at tow supply voltages, the on-current is significantly lower because the CMOS transistor may be operating close to its threshold voltage. Conversely, TFETs have been shown to achieve sharper turn-on behavior (i.e., steeper subthreshold slope) than CMOS transistors enabling operation lower supply voltages.

There are two common types of TFETs—n-type (nT-FETs) and p-type (pTFETs). For an nTFET, the drain current increases with increasing gate to source voltage ($V_{gs}$) while for a pTFET the negative drain current increases with decreasing (more negative) $V_{gs}$. The nTFET switches on for gate-source voltage ($V_{gs}$) greater than $V_t$ (threshold voltage), while the pTFET switches on for $V_{gs}$ less than $V_t$. The source and drain junctions have different doping types in the case of TFETs compared to CMOS. TFETs can also have different location of junctions on the drain side, but physical shape can be similar to CMOS (e.g., planar, FinFET, nanowire, etc.). The source in an nTFET is p-doped while the drain is n-doped and the source in a pTFET is n-doped while the drain is p-doped.

A TFET shows exponentially increasing and temperature-independent characteristics at both off and on states in an ideal device. Unlike conventional CMOS transistors, where sub-threshold swing has a lower limit of 60 mV/dec at 300K, the sub-threshold swing in TFETs is independent of temperature. As such, off-state leakage can be significantly reduced using TFETs. A TFET has a steeper and more desirable subthreshold slope. This enables higher on-currents than with the CMOS transistors when the devices are driven at low supply voltages.

Various embodiments describe a flip-flop (FF) and a latch that use the asymmetric conduction characteristic present in the TFET current-voltage (I-V) curve to enable a reduction in circuit size and complexity compared to a conventional FF design. In some embodiments, a hybrid sequential logic is described that is formed using TFET and CMOS transistors.

FIG. 1 illustrates plots 101 and 102 showing the current-voltage (IV) characteristics of an NMOS with symmetric conduction and an nTFET with asymmetric conduction with respect to the drain-source bias, respectively. Here, asymmetric conduction refers to one sided conduction. For example, plot 102 shows almost zero conduction (Note, this is in a linear scale, and there may still be low levels of current) in the forward bias (negative Vds) region and conduction in the reverse bias (positive Vds) region (e.g., subthreshold region) for the nTFET. Conversely, symmetric conduction refers to two sided conduction. For example, plot 101 shows conduction in the forward bias region and conduction in the reverse bias region for the NMOS transistor.

In some embodiments, the reduction in circuit size of the TFET sequential units (e.g., FFs and latches) translates to improved area efficiency, denser layout, and reduced switching capacitance for lower power operation. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "bottom," "over," "under," and the like in the description and in the claims, if any, are used for descriptive purposes and not necessarily for describing permanent relative positions.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used for some transistors without departing from the scope of the disclosure.

Figure 2A:
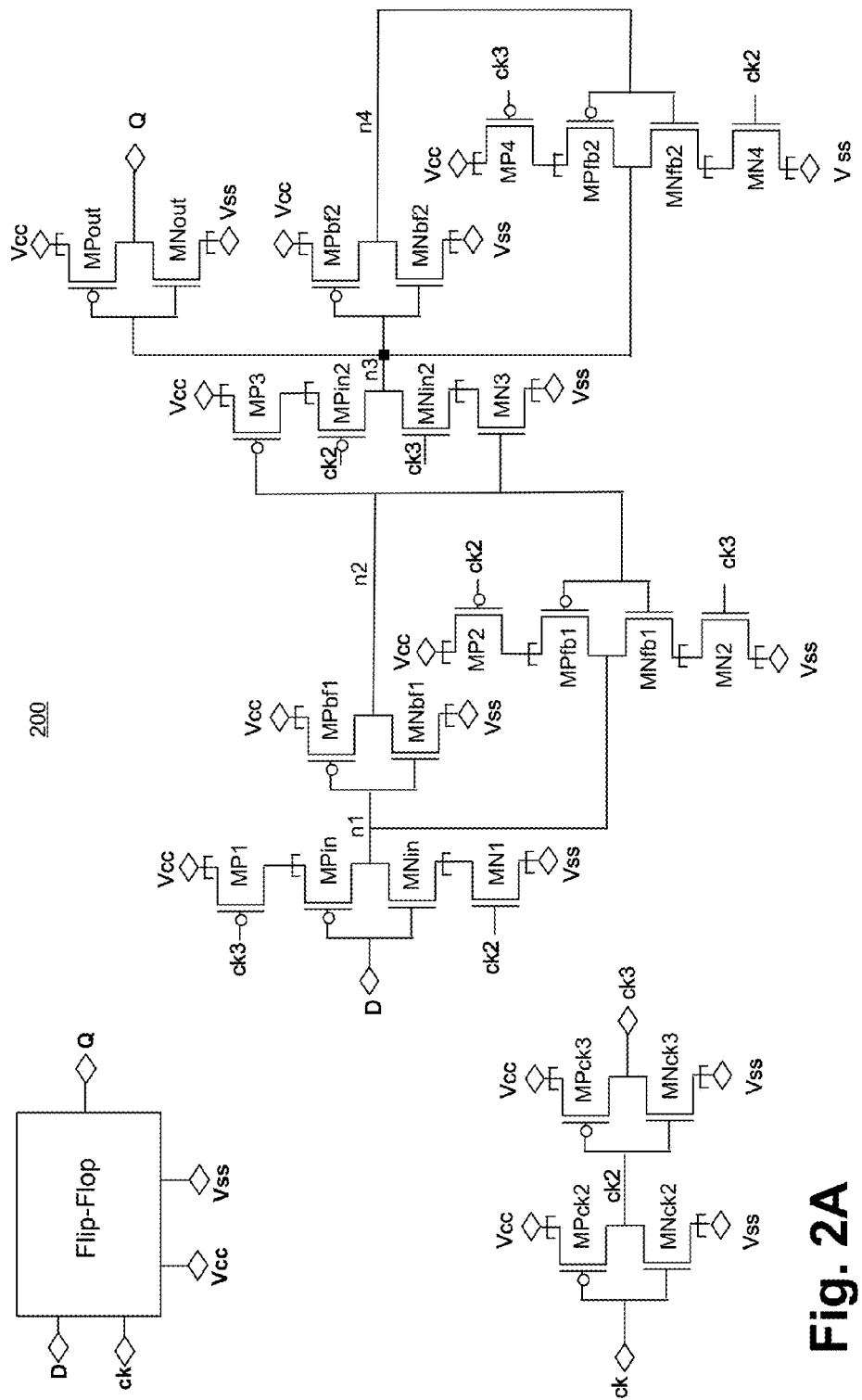
FIG. 2A-B illustrate TFET flip-flops (FFs), according to some embodiments of the disclosure.
Figure 2B:
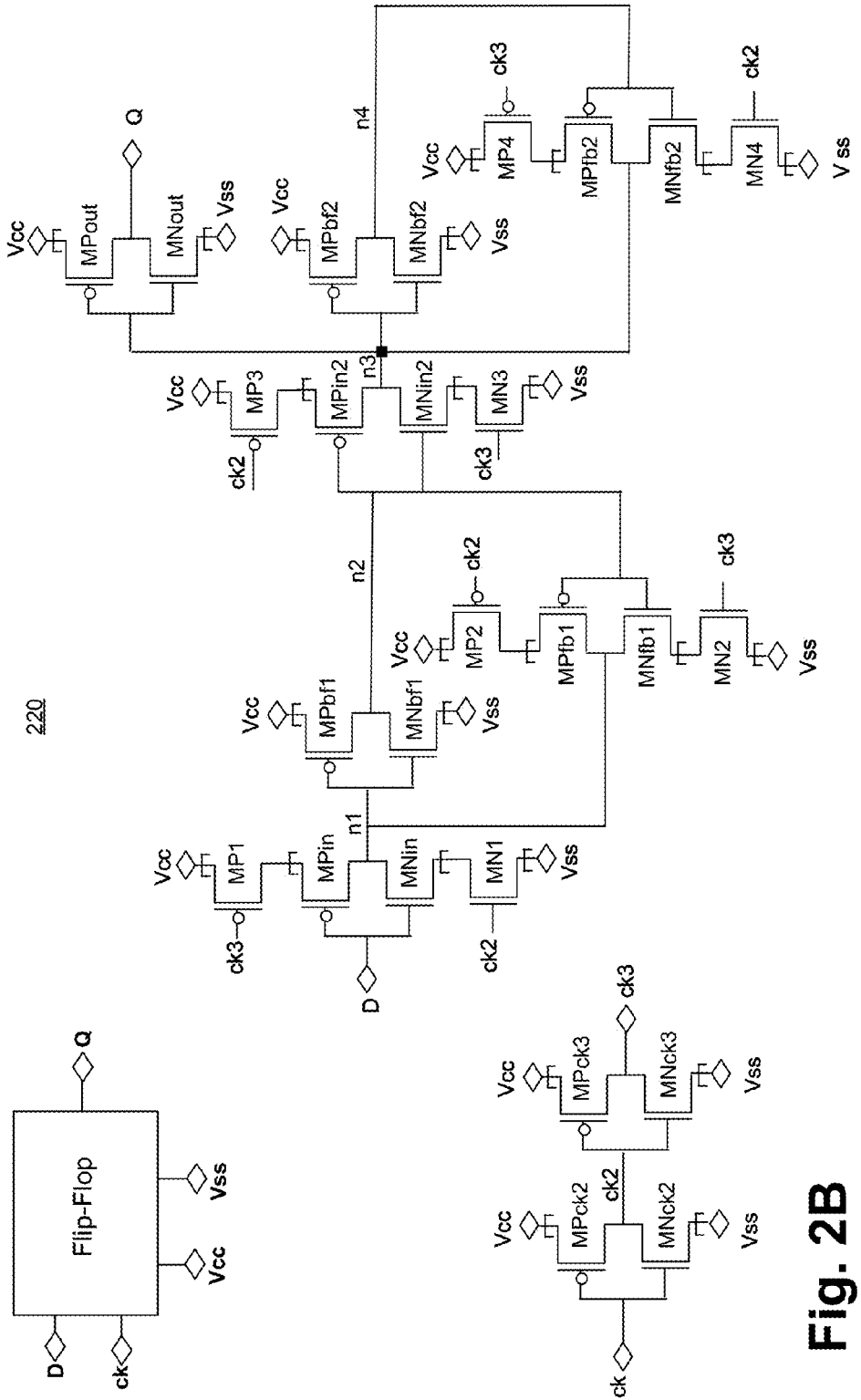

FIGS. 2A-B illustrate TFET FFs 200 and 220, respectively, according to some embodiments of the disclosure. In some embodiments, TFET FF 200 comprises a master stage, a slave stage, and a clocking stage. In some embodiments, the master stage includes a first clock (ck) enabled inverter, a second inverter, and a first feedback clock enabled inverter.

In some embodiments, the first clock enabled inverter includes p-type TFETs (pTFETs) MP1 and MPin, and n-type TFETs (nTFETs) MN1 and MNin coupled together as shown. Here, transistor MP1 is controlled by clock-3 (ck3) while transistor MN1 is controlled by clock-2 (ck2), where input data 'D' is received by transistors MPin and MNin. The output (i.e., drain terminals of transistors MPin and MNin) of the first clock enabled inverter is coupled to node n1. Here, labels for signals and nodes are interchangeably used. For example, ck2 may refer to node ck2 or signal ck2 received at node ck2, depending on the context of the sentence.

In some embodiments, the first inverter includes pTFET MPbf1 and nTFET MNbf1 such that node n1 is coupled to the gate terminals of transistors MPbf1 and MNbf1 while node n2 (i.e., the output node) is coupled to the drain terminals of transistors MPbf1 and MNbf1.

In some embodiments, the first feedback clock enabled inverter includes pTFETs MP2 and MPfb1, and pTFETs MPfb1 and MN2 coupled together as shown. Here, transistor MN2 is controlled by clock signal ck3 while transistor MP2 is controlled by clock signal ck2. In some embodiments, the gate terminals of transistors MPbf1 and MNfb1 are coupled to node n2 while the drain terminals of transistors MPfb1 and MNfb1 are coupled to node n1.

In some embodiments, the master stage includes a second clock enabled inverter, a second inverter, an output inverter, and a second feedback clock enabled inverter.

In some embodiments, the second clock enabled (forward) inverter includes pTFETs MP3 and MPin2, and nTFETs MN3 and MNin2 coupled together as shown. In some embodiments, transistors MPin2 and MNin2 are controlled by clock signals ck2 and ck3, respectively. In some embodiments, the gate terminals of transistors MP3 and MN2 are coupled to node n2. In some embodiments, the output of the second clock enabled inverter is coupled to node n3 (i.e., the drain terminals of transistors MPin2 and MNin2 are coupled to node n3).

In some embodiments, the second buffer inverter comprises transistors MPbf2 and MNbf2 such that the gate terminals of transistors MPbf2 and MNbf2 are coupled to node n3 while the drain terminals of transistors MPbf2 and MNbf2 are coupled to node n4. In some embodiments, the second feedback clock enabled inverter comprises pTFETs MP4 and MPfb2, and nTFETs MN4 and MNfb2 coupled together as shown. In some embodiments, the gate terminals of transistors MPbf3 and MNfb2 are coupled to node n4 while the drain terminals of transistors MNfb2 and MPbf2 are coupled to node n3. In some embodiments, transistors MP4 and MN3 are controlled by clock signals ck3 and ck2, respectively.

In some embodiments, the output inverter comprises transistors MPout and MNout such that the gate terminals of these transistors are coupled to node n3 while the drain terminals of these transistors are coupled to the output Q. Here, power supply is Vcc and ground supply is Vss.

In some embodiments, clock signals ck2 and ck3 are provided by a clocking source which includes two inverters coupled in series. In some embodiments, an input clock signal ck is received by the first inverter of the clocking source having TFETs MPck2 and MNck2. The output of the first inverter of the clocking source is clock signal ck2. In some embodiments, clock signal ck2 is received by the second inverter of the clocking source having TFETs MPck2 and MNck3. The output of the second inverter of the clocking source is clock signal ck3. The embodiment of FIG. 2A is considered here as a baseline TFET FF.

The TFET FF 220 of FIG. 2B is similar to TFET FF 200 of FIG. 2A except for the following main difference(s). In some embodiments, the inputs of TFETs MPin2 and MNin2 are coupled to node n2 while TFETs MP2 and MN2 are controlled by clock signals ck2 and ck3, respectively.

Figure 3A:
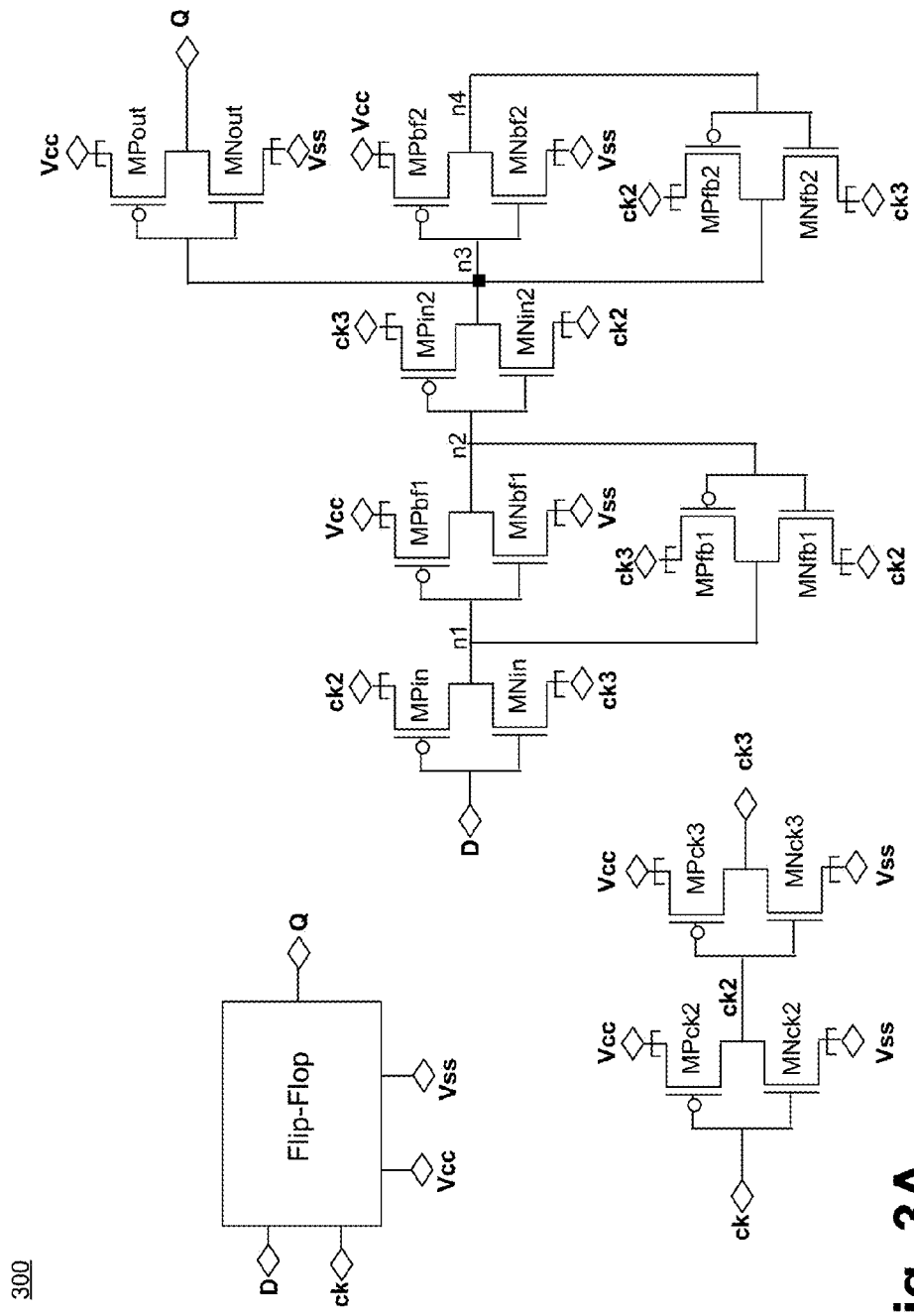
FIG. 3A illustrates a TFET FF, according to some embodiments of the disclosure.

FIG. 3A illustrates TFET FF 300, according to some embodiments of the disclosure. It is pointed out that those elements of FIG. 3A having the same reference numbers (or names) as the elements of any other figure can operate or function in any manner similar to that described, but are not limited to such.

In some embodiments, TFET FF 300 comprises a master stage, a slave stage, an output stage, and a clocking source. In some embodiments, the master stage comprises a first pair of TFET devices MPin and MNin. In some embodiments, the gate terminals of transistors MPin and MNin are coupled to node 'D'. Here, node names and signal names are interchangeably used. For example, 'D' may refer to data signal 'D' on node 'D' or it may refer to node 'D' depending on the context of the sentence. In some embodiments, the source terminal of transistor MPin is coupled to node ck2 while the source terminal of transistor MNin is coupled to node ck3. Compared to the first clocked inverter of FIGS. 2A-B, here fewer transistors are used at this first stage.

In some embodiments, the master stage further comprises a first inverter which is the same as the first inverter described with reference to FIGS. 2A-B. Like in FIGS. 2A-B, the drain terminals of transistors MPin and MNin are coupled to node n1 and the gate terminals of transistors MPbf1 and MNbf1 are coupled to node n1. Referring back to FIG. 3A, in some embodiments, the master stage further comprises a second pair of TFET devices (also referred to as the first feedback pair) which include transistors MPfb1 and MNfb1. In some embodiments, the gate terminals of transistors MPfb1 and MNfb1 are coupled to node n2 (which is also coupled to the drain terminals of transistors MPbf1 and MNbf1). In some embodiments, the source terminals of transistors MPbf1 and MNbf1 are coupled to nodes ck3 and ck2, respectively. In some embodiments, the drain terminals of transistors MPbf1 and MNbf1 are coupled to node n1. Compared to the first feedback clock enabled inverters of FIGS. 2A-B, here fewer transistors are used.

Referring back to FIG. 3A, in some embodiments, the slave stage comprises a third pair of TFET devices MPin2 and MNin2. In some embodiments, the gate terminals of transistors MPin2 and MNin2 are coupled to node n2 while the drain terminals of transistors MPin2 and MNin2 are coupled to node n3. In some embodiments, the source terminals of transistors MPin2 and MNin2 are coupled to ck3 and ck2, respectively. In some embodiments, the slave stage further comprises a second inverter having TFETs MPbf2 and MNbf2 coupled together as shown. In some embodiments, the gate terminals of transistors MPbf2 and MNbf2 are coupled to node n3 while the drain terminals of transistors MPbf2 and MNbf2 are coupled to node n4. In some embodiments, the second inverter of FIG. 3A is the same as the second inverter of the slave stage described with reference to FIGS. 2A-B.

Referring back to FIG. 3A, in some embodiments, the master stage comprises a second feedback inverter or TFET pair which includes TFETs MPfb2 and MNfb2 coupled together as shown. In some embodiments, the gate terminals of transistors MPfb2 and MNfb2 are coupled to node n4 while the drain terminals of transistors MPfb2 and MNfb2 are coupled to node n3. In some embodiments, the source terminals of transistors MPbf2 and MNbf2 are coupled to ck2 and ck3, respectively. Compared to the second feedback inverter of FIGS. 2A-B, here fewer transistors are used at this stage.

In some embodiments, an output stage is provided to buffer the output stored on node n3. In some embodiments, the output stage comprises TFETs MPout and MNout coupled together as an inverter. In some embodiments, the gate terminals of TFETs MPout and MNout are coupled to node n3 while the drain terminals are coupled to the output node 'Q'.

While various embodiments here are described with reference to rising edge triggered sequential logic, the embodiments are applicable to falling edge triggered sequential logic too. For example, by inverting the clock signals received by the TFETs of FF 300, a falling edge triggered TFET FF can be implemented. In some embodiments, a falling edge triggered TFET FF can be implemented by swapping the clock signals. For example, by swapping clock signal ck2 with ck3 in TFET FF 300, a falling edge triggered TFET FF can be implemented.

One reason for being able to use clock signals ck2 and ck3 at the source terminals of various TFETs in FF 300 is the uni-directionality offered by TFET devices. By exploiting this electrical phenomena (as illustrated by plot 102 of FIG. 1B), a FF can be designed with fewer transistors and less active power.

Table 1 compares the performance of TFET FF 200 of FIG. 2A with TFET FF 320 of FIG. 3A. For both TFET FFs, Vcc is 0.35V. Here, performance is gauged by the difference between the time it takes for an output at node 'Q' to be generated upon a rising edge of the clock (i.e., $t_{clk2q}$) and the setup time ($t_{setup}$). The smaller the difference, the higher the performance. Performance of TFET FFs is also measured by leakage power, active power, transistor count (e.g., area), and source-drain diffusion conflicts. Leakage power is primarily the result of unwanted subthreshold current in the transistor channel when the transistor is turned off. Active power is primarily the result of dynamic operation of the transistor ($CV^2*f$).

Connected source and drain terminals of separate MOSFETs (i.e., serial devices) may be overlapping or adjacent in a MOSFET layout; but TFET source and drain terminals must be separated in a TFET layout. The TFET source terminal is formed from a different material than the TFET drain terminal, and thus must be separate in the layout to avoid a source/drain diffusion conflict. The addition of space between the source and drain terminals may increase the layout area of some TFET circuits, and thus circuit designs with fewer conflicts may have more compact layout.

TABLE 1

|  | TFET Flip-Flop 200 of FIG. 2A | TFET Flip-Flop 300 of FIG. 3A | Comparison |
|---|---|---|---|
| Performance Metric ($t_{clk2q}$-$t_{setup}$) [ps] | 115 | 100 | 0.87X |
| Leakage Power [nW] | 0.2 | 0.2 | 1.0X |
| Active Power [μW] | 0.16 | 0.11 | 0.68X |
| Transistor Count | 26 | 18 | 0.69X |
| Source/Drain Diffusion Conflicts (Lower better for layout) | 8 | 0 | |

Table 1 shows that TFET FF 300 outperforms TFET FF 200 in almost all performance metrics.

Figure 3B:
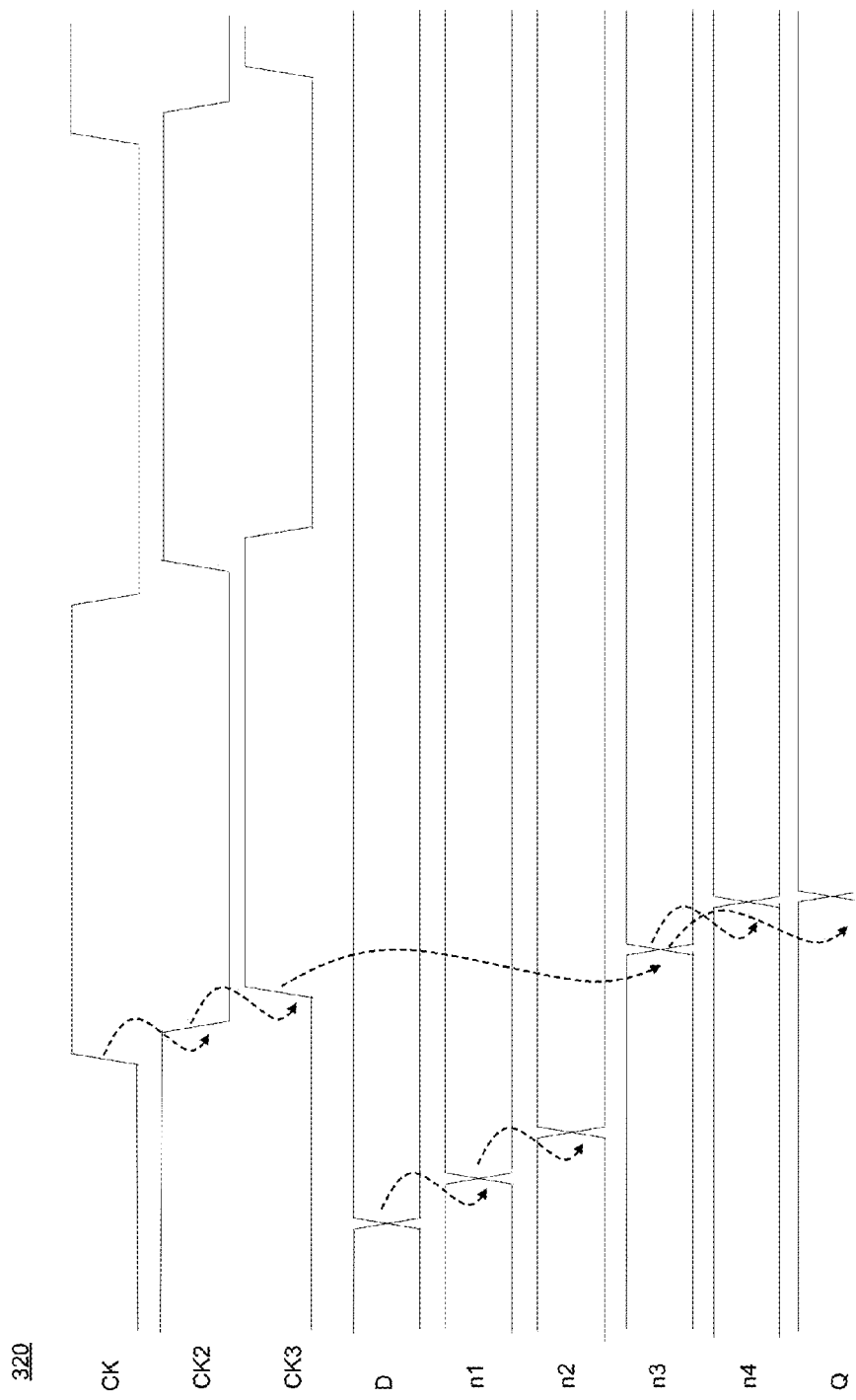
FIG. 3B illustrates a timing diagram of the TFET FF of FIG. 3A, according to some embodiments of the disclosure.

FIG. 3B illustrates timing diagram 320 of the TFET FF 300 of FIG. 3A, according to some embodiments of the disclosure. It is pointed out that those elements of FIG. 3B having the same reference numbers (or names) as the elements of any other figure can operate or function in any manner similar to that described, but are not limited to such. The first three waveforms in timing diagram 320 are clock signals ck, ck2, and ck3 which are generated by the clocking source. The arrows indicate the triggering behavior. For example, the rising edge of clock signal ck3 results in updating data on node n3. The operation of TFET FF 300 is like any other known FF but with smaller area and power consumption.

By applying clock signals (e.g., ck2 and ck3) to the source terminals of various TFETs in FF 300, the extra transistors for clock gating or clock enabling the inverters are removed, in accordance with some embodiments.

Figure 4:
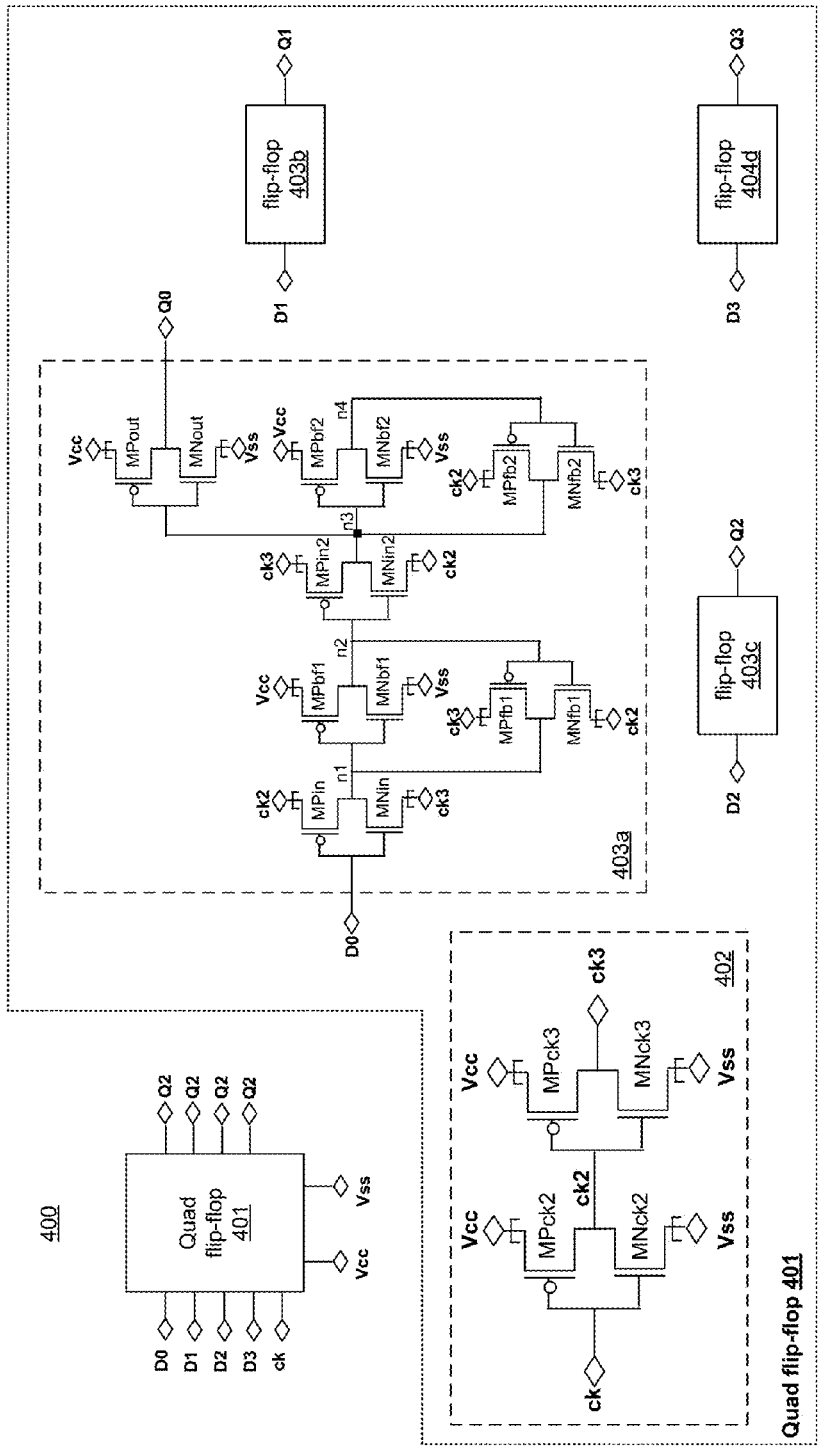
FIG. 4 illustrates a TFET multi-bit FF, according to some embodiments of the disclosure.

FIG. 4 illustrates TFET multi-bit FF 400, according to some embodiments of the disclosure. It is pointed out that those elements of FIG. 4 having the same reference numbers (or names) as the elements of any other figure can operate or function in any manner similar to that described, but are not limited to such.

In this example, a quad TFET FF 401 is illustrated as TFET multi-bit FF. Multi-bit FFs (e.g., ganged FFs) are often used so that common FF circuits and layout elements can be shared between multiple storage elements.

In some embodiments, quad TFET FF 401 comprises a clocking source 402 which is the same as the clocking source described with reference to FIGS. 2A-B and FIG. 3A. In some embodiments, quad TFET FF 401 further comprises four FFs 403a, 403b, 403c, and 404d. In some embodiments, each FF receives one bit of data and generates a one bit output. For example, FF 403a receives one bit data D0 and outputs a one bit output Q0; FF 403b receives one bit data D1 and outputs one bit output Q1; FF 403c receives one bit data D2 and outputs one bit output Q2; and FF 403d receives one bit data D3 and outputs one bit output Q3. In some embodiments, the implementation of each FF is according to the TFET FF of FIGS. 2A-B. In some embodiments, the implementation of each FF is according to TFET FF 300 of FIG. 3A. In one such embodiment, more circuit elements can be shared compared to the circuit elements of TFET FF of FIGS. 2A-B. In some embodiments, TFET FF 401 is a quad-FF designed to store four bits. Other possible embodiments could be designed to store 2, 3, or more bits by further combining multiple instances of sub circuit 403a with one or more instance of sub circuit 402, in accordance with some embodiments.

Figure 5:
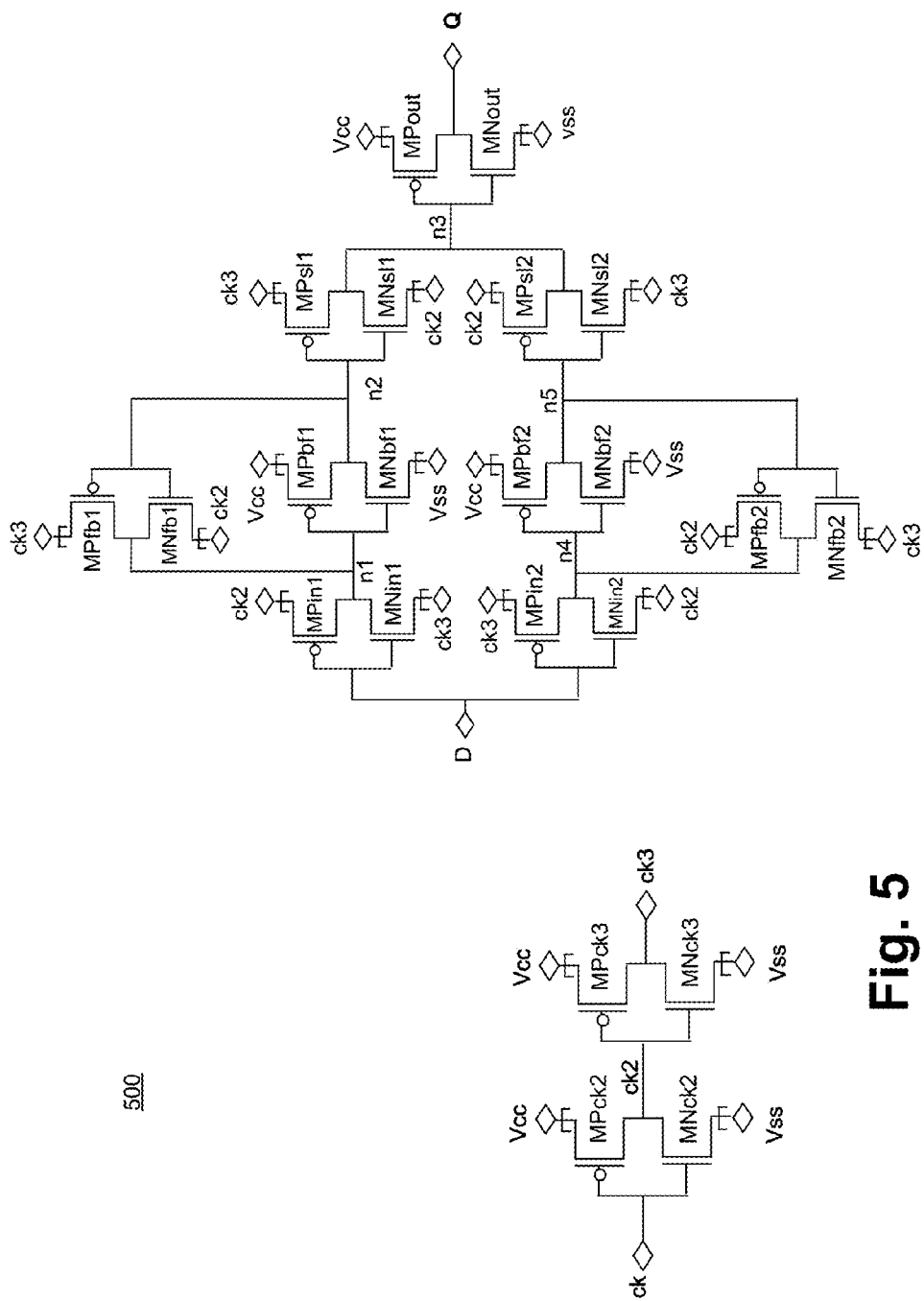
FIG. 5 illustrates a TFET dual-edge FF, according to some embodiments of the disclosure.

FIG. 5 illustrates TFET dual-edge FF 500, according to some embodiments of the disclosure. It is pointed out that those elements of FIG. 5 having the same reference numbers (or names) as the elements of any other figure can operate or function in any manner similar to that described, but are not limited to such. Dual-edge FFs can be used to reduce clock power. In a dual-edge FF, data is sampled at both rising and falling edges of the clock signal.

In some embodiments, TFET dual-edge FF 500 comprises two pairs of TFET clock enabled inverters coupled in parallel to sample input data 'D.' In some embodiments, the first pair of TFET clock enabled inverter comprises TFETs MPin1 and MNin1 coupled together as shown. In some embodiments, the gate terminals of TFETs MPin1 and MNin1 are coupled to node 'D'. In some embodiments, the drain terminals of TFETs MPin1 and MNin1 are coupled to node n1. In some embodiments, the source terminals of transistors MPin1 and MNin1 are coupled to nodes ck2 and ck3, respectively. In some embodiments, the second pair of TFET clock enabled inverter comprises TFETs MPin2 and MNin2 coupled together as shown. In some embodiments, the gate terminals of TFETs MPin2 and MNin2 are coupled to node 'D'. In some embodiments, the drain terminals of TFETs MPin2 and MNin2 are coupled to node n4. In some embodiments, the source terminals of transistors MPin2 and MNin2 are coupled to ck3 and ck2, respectively.

In some embodiments, TFET dual-edge FF 500 comprises first and second TFET inverters. In some embodiments, the first TFET inverter comprises TFETs MPbf1 and MNbf1 coupled together as shown. In some embodiments, the gate terminals of TFETs MPbf1 and MNbf1 are coupled to node n1 while the drain terminals of TFETs MPbf1 and MNbf1 are coupled to node n2. In some embodiments, the source terminals of transistors MPbf1 to MNbf1 are coupled to Vcc and Vss, respectively. In some embodiments, the second TFET inverter comprises TFETs MPbf2 and MNbf2 coupled together as shown. In some embodiments, the gate terminals of TFETs MPbf2 and MNbf2 are coupled to node n4 while the drain terminals of TFETs MPbf2 and MNbf2 are coupled to node n5. In some embodiments, the source terminals of transistors MPbf2 to MNbf2 are coupled to Vcc and Vss, respectively.

In some embodiments, TFET dual-edge FF 500 comprises third and fourth pairs of TFET clock enabled inverters coupled to the output of the first and second TFET inverters, respectively. In some embodiments, the third pair of TFET clock enabled inverters comprise TFETs MPsl1 and MNsl1 coupled together as shown. In some embodiments, the gate terminals of transistors MPsl1 and MNsl1 are coupled to node n2. In some embodiments, the drain terminals of transistors MPsl1 and MNsl1 are coupled to node n3. In some embodiments, the source terminals of transistors MPsl1 and MNsl1 are coupled to nodes ck3 and ck2, respectively. In some embodiments, the fourth pair of TFET clock enabled inverters comprises TFETs MPsl2 and MNsl2 coupled together as shown. In some embodiments, the gate terminals of transistors MPsl2 and MNsl2 are coupled to node n5. In some embodiments, the drain terminals of transistors MPsl2 and MNsl2 are coupled to node n3. In some embodiments, the source terminals of transistors MPsl2 and MNsl2 are coupled to nodes ck2 and ck3, respectively.

In some embodiments, TFET dual-edge FF 500 comprises fifth and sixth pairs of TFET clock enabled feedback inverters coupled to the output of the first and second TFET inverters, respectively.

In some embodiments, the fifth pair of TFET clock enabled inverters comprises TFETs MPfb1 and MNfb1 coupled together as shown. In some embodiments, the gate terminals of transistors MPfb1 and MNfb1 are coupled to node n2. In some embodiments, the drain terminals of transistors MPfb1 and MNfb1 are coupled to node n1. In some embodiments, the source terminals of transistors MPfb1 and MNfb1 are coupled to nodes ck3 and ck2, respectively. In some embodiments, the sixth pair of TFET clock enabled inverters comprises TFETs MPfb2 and MNfb2 coupled together as shown. In some embodiments, the gate terminals of transistors MPfb2 and MNfb2 are coupled to node n5. In some embodiments, the drain terminals of transistors MPfb2 and MNfb2 are coupled to node n4. In some embodiments, the source terminals of transistors MPfb2 and MNfb2 are coupled to nodes ck2 and ck3, respectively.

In some embodiments, TFET dual-edge FF 500 comprises an output stage or an output inverter. In some embodiments, the output inverter includes transistors MPout and MNout coupled together as shown. In some embodiments, the gate terminals of transistors MPout and MNout are coupled to node n3. In some embodiments, the drain terminals of transistors MPout and MNout are coupled to the output 'Q'. In some embodiments, the source terminals of transistors MPout and MNout are coupled to Vcc and Vss, respectively.

In some embodiments, when ck2 is low ck3 is high, the cross-coupled inverter pairs including devices MPfb1, MNfb1, MPbf1, and MNbf1 hold the logical state of the input and devices MPsl1 and MNsl1 drive n3 to the value stored in the cross-coupled inverter pair. In some embodiments, when ck3 is low and ck2 is high, the cross-coupled inverter pairs including device MPfb2, MNfb2, MPbf2, and MNbf2 hold the logical state of the input and devices MPsl2 and MNsl2 drive n3 to the value stored in the cross-coupled inverter pair. Because devices MPsl1 and MNsl1 and devices MPsl2 and MNsl2 are enabled by logically inverse clock signals, dual-edge FF 500 is capable of outputting the input logic value that occurs merely near a falling or rising clock transition, in accordance with some embodiments.

Figure 6:
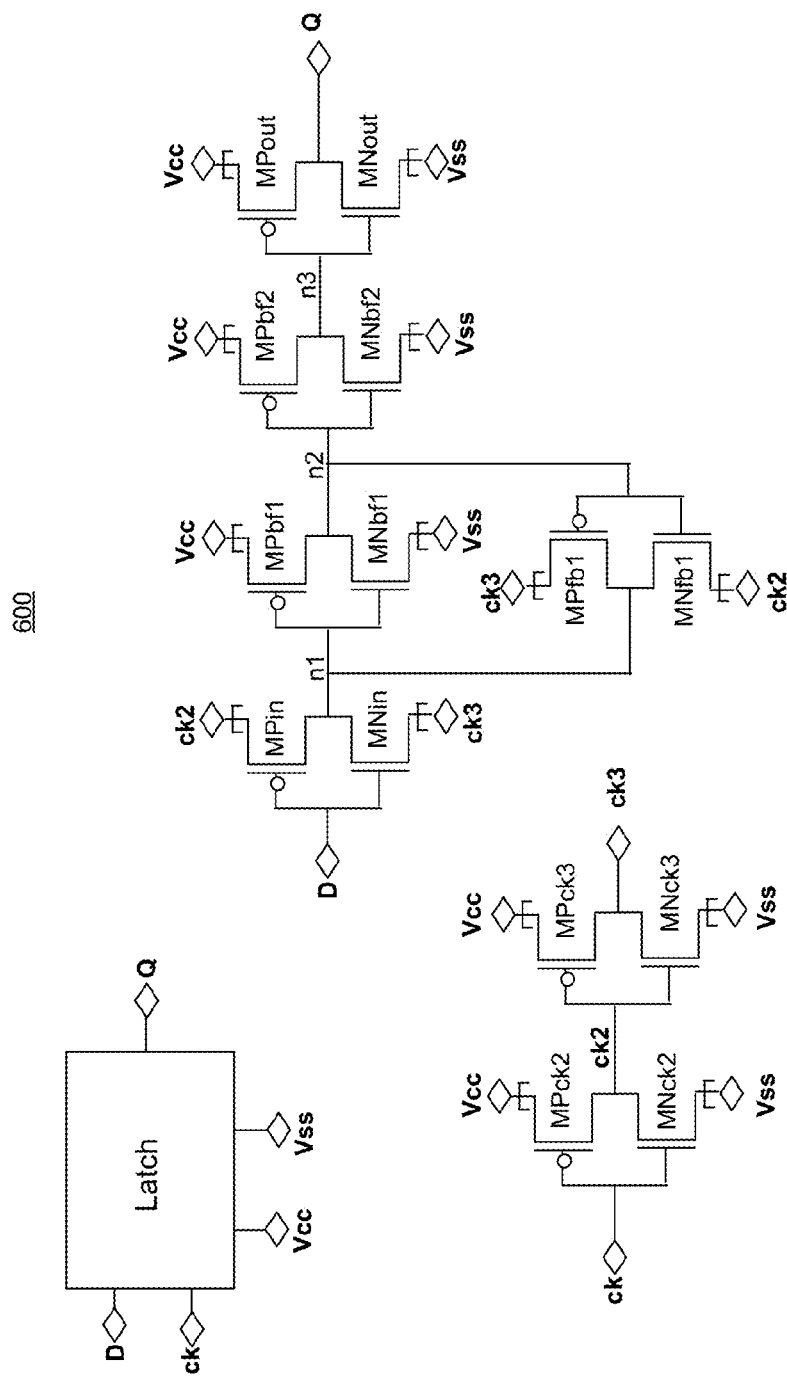
FIG. 6 illustrates a TFET latch, according to some embodiments of the disclosure.

FIG. 6 illustrates TFET latch 600, according to some embodiments of the disclosure. It is pointed out that those elements of FIG. 6 having the same reference numbers (or names) as the elements of any other figure can operate or function in any manner similar to that described, but are not limited to such.

A latch, like a FF, also has two stable states and can be used to store state information. As opposed to FFs, which are edge triggered storage devices, latches are level sensitive storage devices (e.g., when a latch is enabled it becomes transparent, while a FFs output only changes on a single type (positive going or negative going) of clock edge).

In some embodiments, TFET latch 600 comprises the master stage of TFET FF 300 such that the output of the master stage is coupled to an output inverter (having TFETs MPout and MNout). The master stage includes the first pair of TFET devices MPin and MNin, the first inverter having TFET devices MPbf1 and MNbf1, the first clock enabled feedback inverter TFET MPfb1 and MNfb1, second buffer inverter TFETs MPbf2 and MNbf2; and the output inverter having TFETs MPout and MNout coupled together as shown.

While FIG. 6 is described with reference to high level sensitive latch, the embodiments are applicable to low level sensitive latches too. For example, by inverting the clocks received by the TFETs of latch 600, a low level sensitive TFET latch can be implemented. In some embodiments, a low level sensitive TFET latch can be implemented by swapping the clock signals. For example, by swapping node ck2 with node ck3 in TFET latch 600, a low level sensitive TFET latch can be implemented.

Figure 7:
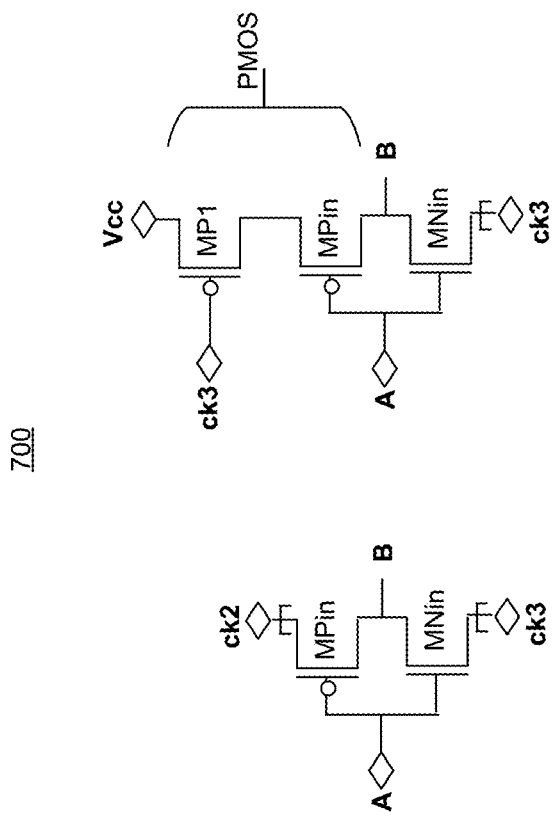
FIG. 7 illustrates a hybrid TFET-MOS latch, according to some embodiments of the disclosure.

FIG. 7 illustrates hybrid TFET-MOS circuit 700, according to some embodiments of the disclosure. It is pointed out that those elements of FIG. 7 having the same reference numbers (or names) as the elements of any other figure can operate or function in any manner similar to that described, but are not limited to such. In some embodiments, hybrid TFET-MOS circuit 700 is achieved by using TFETs to enable logic operation that improve due to unidirectional conduction, but choose either TFET or MOSFET for the other transistors.

In some embodiments, the TFET pairs, in which clocks are received by the source terminals of the TFETs, can be replaced with hybrid TFET-MOS circuit 700. The circuit on the left side in FIG. 7 is a TFET pair having TFETs MPin and MNin with their gate terminals coupled to node 'A,' their drain terminals coupled to node 'B,' and their source terminals coupled to nodes ck2 and ck3, respectively. This circuit can be replaced with a hybrid of TFET and MOS as illustrated by the circuit on the right side in FIG. 7.

In some embodiments, hybrid TFET-MOS circuit 700 comprises PMOS transistors MP1 and MPin and TFET transistor MNin. In some embodiments, the PMOS transistor MP1 includes a source terminal coupled to Vcc, gate terminal controlled by ck3, and drain terminal coupled to the source terminal of TFET PMOS transistor MPin. In some embodiments, PMOS MPin has a gate terminal coupled to node 'A' and a drain terminal coupled to node 'B.' In some embodiments, TFET MNin has a gate terminal coupled to node 'A,' drain terminal coupled to node 'B,' and source terminal coupled to ck3.

Figure 8:
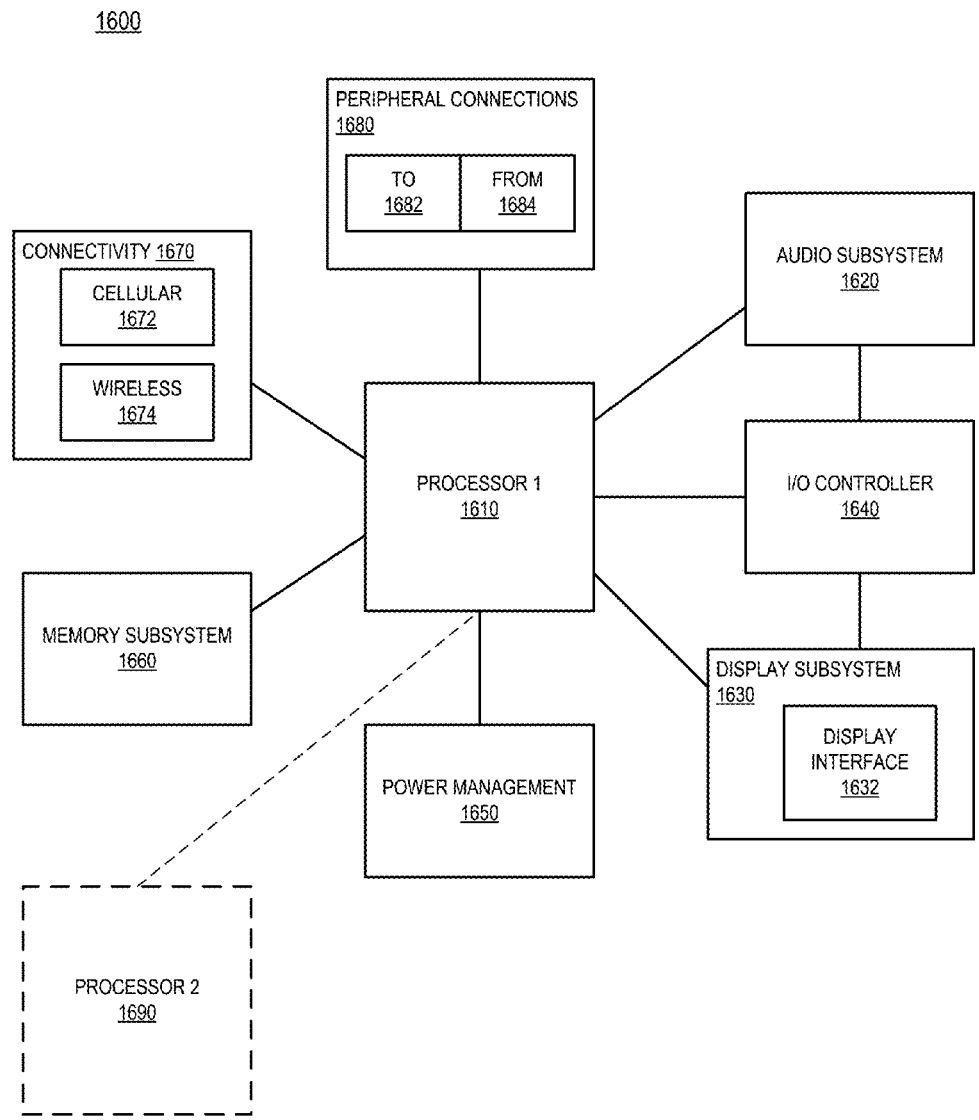
FIG. 8 illustrates a smart device or a computer system or a System-on-Chip (SoC) with TFET based sequential logic, according to some embodiments.

FIG. 8 illustrates a smart device or a computer system or a SoC with TFET based sequential logic (e.g., FF and/or latch), according to some embodiments. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with TFET based sequential logic, according to some embodiments discussed. Other blocks of the computing device 1600 may also include TFET based sequential logic, according to some embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. In some embodiments, audio subsystem 1620 includes apparatus and/or machine executable instructions to avoid self-hearing, according to some embodiments. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first p-type Tunneling Field-Effect Transistor (TFET); a first n-type TFET coupled in series with the first p-type TFET; a first node coupled to gate terminals of the first p-type and n-type TFETs; a first clock node coupled to a source terminal of the first p-type TFET, the first clock node is to provide a first clock; and a second clock node coupled to a source terminal of the first n-type TFET, the second clock node is to provide a second clock.

In some embodiments, the apparatus comprises: a first TFET inverter having an input coupled to drain terminals of the first p-type and n-type TFETs, respectively, and an output. In some embodiments, a second p-type TFET having a source terminal coupled to the second clock node and a gate terminal coupled to the output of the first TFET inverter; and a second n-type TFET coupled in series with the second p-type TFET, the second n-type TFET having a source terminal coupled to the first clock node, and having a gate terminal coupled to the output of the first TFET inverter.

In some embodiments, the drain terminals of the second p-type and n-type TFETs are coupled to the drain terminals of the first p-type and n-type TFETs. In some embodiments, the apparatus comprises: a third p-type TFET having a source terminal coupled to the second clock node, and having a gate terminal coupled to the output of the first TFET inverter; and a third n-type TFET coupled in series with the third p-type TFET, the third n-type TFET having a source terminal coupled to the first clock node, and having a gate terminal coupled to the output of the first TFET inverter. In some embodiments, the apparatus comprises: a second TFET inverter having an input coupled to drain terminals of the third p-type and n-type TFETs, respectively, and an output.

In some embodiments, the apparatus comprises: a fourth p-type TFET having a source terminal coupled to the first clock node, and having a gate terminal coupled to the output of the second TFET inverter; and a fourth n-type TFET coupled in series with the fourth p-type TFET, the fourth n-type TFET having a source terminal coupled to the second clock node, and having a gate terminal coupled to the output of the second TFET inverter.

In some embodiments, the drain terminals of the fourth p-type and n-type TFETs are coupled to the drain terminals of the third p-type and n-type TFETs. In some embodiments, the apparatus comprises a third TFET inverter having an input coupled to drain terminals of the third p-type and n-type TFETs, respectively, and an output. In some embodiments, the apparatus comprises a pair of inverters to generate the first and second clocks from a clock source. In some embodiments, the second clock is an inverse of the first clock.

In another example, a system is provided comprises: a memory; a processor coupled to the memory, the processor includes a flip-flop (FF) having an apparatus according to the apparatus described above; and a wireless interface for allowing the processor to communicate with another device. In some embodiments, the flip-flop includes a combination of MOSFETs and TFETs.

In another example, an apparatus is provided which comprises: a first clock node to provide a first clock; a second clock node to provide a second clock, the second clock is to be an inverse of the first clock; a first pair of Tunneling Field-Effect Transistors (TFETs) including: a p-type TFET having a source terminal coupled to the first clock node; a n-type TFET coupled in series with the p-type TFET, the n-type TFET having a source terminal coupled to the second clock node; and a node coupled to gate terminals of the p-type and n-type TFETs, the first node is to receive an input signal; and a second pair of TFETs including: a p-type TFET having a source terminal coupled to the second clock; and a n-type TFET coupled in series with the p-type TFET of the second pair, the n-type TFET of the second pair having a source terminal coupled to the first clock; wherein gate terminals of the p-type and n-type TFETs of the second pair are coupled to the node.

In another example, a system is provided comprises: a memory; a processor coupled to the memory, the processor includes a flip-flop (FF) having an apparatus according to the apparatus described above; and a wireless interface for allowing the processor to communicate with another device. In some embodiments, the flip-flop includes a combination of MOSFETs and TFETs.

In some embodiments, the apparatus comprises: a first inverter having an input coupled to drain terminals of the n-type and p-type TFETs of the first pair of TFETs; and a second inverter having an input coupled to drain terminals of the n-type and p-type TFETs of the second pair of TFETs. In some embodiments, the apparatus comprises a third pair of TFETs including: a p-type TFET having a source terminal coupled to the second clock node; a n-type TFET coupled in series with the p-type TFET of the third pair, the n-type TFET having a source terminal coupled to the first clock node; and a node coupled to gate terminals of the p-type and n-type TFETs of the third pair of TFETs, and also coupled to an output of the first inverter, wherein drain terminals of p-type and n-type TFETs of the third pair are coupled to the input of the first inverter.

In some embodiments, the apparatus comprises a fourth pair of TFETs including: a p-type TFET having a source terminal coupled to the first clock node; a n-type TFET coupled in series with the p-type TFET of the fourth pair, the n-type TFET having a source terminal coupled to the second clock node; and a node coupled to gate terminals of the p-type and n-type TFETs of the fourth pair of TFETs, and also coupled to an output of the second inverter, wherein drain terminals of p-type and n-type TFETs of the fourth pair are coupled to the input of the second inverter.

In some embodiments, the apparatus comprises a fifth pair of TFETs including: a p-type TFET having a source terminal to receive the second clock; a n-type TFET coupled in series with the p-type TFET of the fifth pair, the n-type TFET having a source terminal to receive the first clock; and a node coupled to gate terminals of the p-type and n-type TFETs of the fifth pair of TFETs, and also coupled to an output of the first inverter.

In some embodiments, the apparatus comprises a sixth pair of TFETs including: a p-type TFET having a source terminal coupled to the first clock node; a n-type TFET coupled in series with the p-type TFET of the sixth pair, the n-type TFET having a source terminal coupled to the second clock node; and a node coupled to gate terminals of the p-type and n-type TFETs of the sixth pair of TFETs, and also coupled to an output of the second inverter. In some embodiments, the apparatus comprises a third inverter having an input coupled the fifth and sixth pair of TFETs.

In another example, a system is provided comprises: a memory; a processor coupled to the memory, the processor includes a flip-flop (FF) having an apparatus according to the apparatus described above; and a wireless interface for allowing the processor to communicate with another device. In some embodiments, the flip-flop includes a combination of MOSFETs and TFETs.

In another example, a method is provided which comprises: providing a first clock to a source terminal of a first p-type Tunneling Field-Effect Transistor (TFET); providing a second clock to a source terminal of a first n-type TFET, wherein the first n-type and p-type TFETs are coupled in series; and providing data to gate terminals of the first p-type and n-type TFETs. In some embodiments, the method comprises inverting an output from drain terminals of the first p-type and n-type TFETs to generate an inverted output. In some embodiments, the method comprises: providing the second clock to a source terminal of a second p-type TFET; providing the first clock to a source terminal of a second n-type TFET, wherein the second n-type and p-type TFETs are coupled in series; receiving the inverted output by gate terminals of the second n-type and p-type TFETs; and providing an output from drain terminals of the second n-type and p-type TFETs as input to an inverter that performs the inverting operation.

In another example, an apparatus is provided which comprises: means for providing a first clock to a source terminal of a first p-type Tunneling Field-Effect Transistor (TFET); means for providing a second clock to a source terminal of a first n-type TFET, wherein the first n-type and p-type TFETs are coupled in series; and means for providing data to gate terminals of the first p-type and n-type TFETs. In some embodiments, the apparatus comprises: means for inverting an output from drain terminals of the first p-type and n-type TFETs to generate an inverted output.

In some embodiments, the apparatus comprises: means for providing the second clock to a source terminal of a second p-type TFET; means for providing the first clock to a source terminal of a second n-type TFET, wherein the second n-type and p-type TFETs are coupled in series; means for receiving the inverted output by gate terminals of the second n-type and p-type TFETs; and means for providing an output from drain terminals of the second n-type and p-type TFETs as input to the means for inverting operation.

In another example, a system is provided comprises: a memory; a processor coupled to the memory, the processor includes a flip-flop (FF) having an apparatus according to the apparatus described above; and a wireless interface for allowing the processor to communicate with another device. In some embodiments, the flip-flop includes a combination of MOSFETs and TFETs.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a first p-type Tunneling Field-Effect Transistor (TFET);
    a first n-type TFET directly connected in series with the first p-type TFET;
    a first node coupled to gate terminals of the first p-type and n-type TFETs;
    a first clock node directly connected to a source terminal of the first p-type TFET, the first clock node is to provide a first clock;
    a second clock node coupled to a source terminal of the first n-type TFET, the second clock node is to provide a second clock;
    a first TFET inverter having an input coupled to drain terminals of the first p-type and n-type TFETs, respectively, and an output;
    a second p-type TFET having a source terminal coupled to the second clock node and a gate terminal coupled to the output of the first TFET inverter, wherein drain terminal of the second p-type TFET is coupled to the drain terminal of the first p-type TFET; and a third p-type TFET having a source terminal coupled to the second clock node, and having a gate terminal coupled to the output of the first TFET inverter.

2. The apparatus of claim 1 comprises:
a second n-type TFET coupled in series with the second p-type TFET, the second n-type TFET having a source terminal coupled to the first clock node, and having a gate terminal coupled to the output of the first TFET inverter.

3. The apparatus of claim 2, wherein drain terminal of the second n-type TFET is coupled to the drain terminals of the first p-type and n-type TFETs.

4. The apparatus of claim 2 comprises:
a third n-type TFET coupled in series with the third p-type TFET, the third n-type TFET having a source terminal coupled to the first clock node, and having a gate terminal coupled to the output of the first TFET inverter.

5. The apparatus of claim 4 comprises:
a second TFET inverter having an input coupled to drain terminals of the third p-type and n-type TFETs, respectively, and an output.

6. The apparatus of claim 5 comprises:
a fourth p-type TFET having a source terminal coupled to the first clock node, and having a gate terminal coupled to the output of the second TFET inverter; and
a fourth n-type TFET coupled in series with the fourth p-type TFET, the fourth n-type TFET having a source terminal coupled to the second clock node, and having a gate terminal coupled to the output of the second TFET inverter.

7. The apparatus of claim 6, wherein drain terminals of the fourth p-type and n-type TFETs are coupled to the drain terminals of the third p-type and n-type TFETs.

8. The apparatus of claim 6 comprises:
a third TFET inverter having an input coupled to drain terminals of the third p-type and n-type TFETs, respectively, and an output.

9. The apparatus of claim 1 comprises a pair of inverters to generate the first and second clocks from a clock source.

10. The apparatus of claim 1, wherein the second clock is an inverse of the first clock.

11. An apparatus comprising:
a first clock node to provide a first clock;
a second clock node to provide a second clock, the second clock is to be an inverse of the clock;
a first pair of Tunneling Field-Effect Transistors (TFETs) including:
a p-type TFET having a source terminal directly connected to the clock node;
a n-type TFET directly connected in series with the p-type TFET, the n-type TFET having a source terminal coupled to the second clock node; and
a node coupled to gate terminals of the p-type and n-type TFETs, the node is to receive an input signal;
a second pair of TFETs including:
a p-type TFET having a source terminal coupled to the second clock; and
a n-type TFET coupled in series with the p-type TFET of the second pair, the n-type TFET of the second pair having a source terminal coupled to the clock;
wherein gate terminals of the p-type and n-type TFETs of the second pair are coupled to the node of the pair of TFETs;
a first inverter having an input coupled to drain terminals of the n-type and p-type TFETs of the pair of TFETs; and a third pair of TFETs including:
a p-type TFET having a source terminal coupled to the second clock node;
a n-type TFET coupled in series with the p-type TFET of the third pair, the n-type TFET having a source terminal coupled to the clock node; and
a node coupled to gate terminals of the p-type and n-type TFETs of the third pair of TFETs, and also coupled to an output of the first inverter.

12. The apparatus of claim 11 comprises:
a second inverter having an input coupled to drain terminals of the n-type and p-type TFETs of the second pair of TFETs.

13. The apparatus of claim 12, wherein drain terminals of p-type and n-type TFETs of the third pair are coupled to the input of the first inverter.

14. The apparatus of claim 13 comprises a fourth pair of TFETs including:
a p-type TFET having a source terminal coupled to the first clock node;
a n-type TFET coupled in series with the p-type TFET of the fourth pair, the n-type TFET having a source terminal coupled to the second clock node; and
a node coupled to gate terminals of the p-type and n-type TFETs of the fourth pair of TFETs, and also coupled to an output of the second inverter, wherein drain terminals of p-type and n-type TFETs of the fourth pair are coupled to the input of the second inverter.

15. The apparatus of claim 14, comprises a fifth pair of TFETs including:
a p-type TFET having a source terminal to receive the second clock;
a n-type TFET coupled in series with the p-type TFET of the fifth pair, the n-type TFET having a source terminal to receive the first clock; and
a node coupled to gate terminals of the p-type and n-type TFETs of the fifth pair of TFETs, and also coupled to an output of the first inverter.

16. The apparatus of claim 15, comprises a sixth pair of TFETs including:
a p-type TFET having a source terminal coupled to the first clock node;
a n-type TFET coupled in series with the p-type TFET of the sixth pair, the n-type TFET having a source terminal coupled to the second clock node; and
a node coupled to gate terminals of the p-type and n-type TFETs of the sixth pair of TFETs, and also coupled to an output of the second inverter.

17. The apparatus of claim 16, comprises a third inverter having an input coupled the fifth and sixth pair of TFETs.

18. A system comprising:
a memory;
a processor coupled to the memory, the processor includes a flip-flop which comprises:
a first p-type Tunneling Field-Effect Transistor (TFET);
a first n-type TFET directly connected in series with the first p-type TFET;
a first node coupled to gate terminals of the first p-type and n-type TFETs;
a first clock node directly connected to a source terminal of the first p-type TFET, the first clock node is to provide a first clock; and
a second clock node coupled to a source terminal of the first n-type TFET, the second clock node is to provide a second clock; and
a wireless interface for allowing the processor to communicate with another device.

19. The system of claim 18, wherein the flip-flop comprises:
a first TFET inverter having an input coupled to drain terminals of the first p-type and n-type TFETs, respectively, and an output.

20. The system of claim 18, wherein the flip-flop includes a combination of MOSFETs and TFETs.

\* \* \* \* \*